United States Patent [19]

Barzynski et al.

[11] 4,205,139

[45] May 27, 1980

[54] CURABLE COATING COMPOSITION

[75] Inventors: Helmut Barzynski, Bad Durkheim; Heinrich Hartmann, Limburgerhof; Dieter Lautenbach, Schifferstadt; Rolf Osterloh, Ludwigshafen; Lutz Goethlich, Ludwigshafen; Guenter Heil, Ludwigshafen, all of Fed. Rep. of Germany

[73] Assignee: BASF Aktiengesellschaft, Fed. Rep. of Germany

[21] Appl. No.: 819,816

[22] Filed: Jul. 28, 1977

Related U.S. Application Data

[63] Continuation of Ser. No. 603,445, Aug. 11, 1975, abandoned.

[30] Foreign Application Priority Data

Aug. 28, 1974 [DE] Fed. Rep. of Germany ....... 2441148

[51] Int. Cl.² ............................................. C08L 67/06

[52] U.S. Cl. ................... 525/38; 204/159.15; 204/159.22; 204/159.23; 204/159.24; 525/44; 525/46; 525/47; 525/326; 525/374; 525/375; 525/455; 525/529; 526/307; 526/328.5

[58] Field of Search ............... 260/867, 870, 857 N, 260/868; 526/307, 328.5; 204/159.15, 159.22, 159.23, 159.24

[56] References Cited

U.S. PATENT DOCUMENTS

2,820,020 1/1958 Filipasic ............................ 260/870

*Primary Examiner*—J. Ziegler
*Attorney, Agent, or Firm*—Keil & Witherspoon

[57] ABSTRACT

Curable coating compositions of olefinically unsaturated compounds A and an N-vinyl compound B. The N-vinyl compounds carry at least 2 N-vinyl groups and at least one carbonyl group bonded to the nitrogen of the N-vinyl group. The coating compositions can be used for the manufacture of paints, printing inks, printing plates and photoresist materials.

7 Claims, No Drawings

CURABLE COATING COMPOSITION

This is a continuation of application Ser. No. 603,445, filed Aug. 11, 1975, now abandoned.

The present invention relates to a curable coating composition which contains a polymerizable unsaturated compound A and a copolymerizable compound B with at least 2 N-vinyl groups.

Coating agents comprising solutions of high molecular weight or low molecular weight unsaturated compounds in vinyl monomers have been disclosed. Such systems can be cured with high energy radiation if vinyl compounds which copolymerize rapidly, e.g. acrylic compounds, are used. However, acrylic compounds have the disadvantage that they are generally toxic and cause severe skin irritation. Furthermore, oxygen inhibits the curing of such coatings.

The use of N-vinyl compounds to replace acrylic monomers partially or completely has also already been proposed. For example, German Published Application No. 2,049,715 discloses radiation-curable coatings of unsaturated polyesters and N-vinylpyrrolidone. However, the incorporation of N-vinylpyrrolidone renders the coatings hydrophilic, and their sensitivity to water is objectionable for certain applications, for example as protective coatings. Furthermore, the rate of curing and the density of crosslinking is not fully satisfactory, if N-vinylpyrrolidone is used. N-Vinylpyrrolidone is completely unsuitable for use in printing ink binders, above all for off-set printing, because of its relatively high vapor pressure and its solubility in water.

It is an object of the present invention to provide curable coatings which do not suffer from the above disadvantages.

We have found that this object is achieved by a curable coating (A) one or more olefinically monounsaturated or polyunsaturated compounds, with a molecular weight of from 70 to 20,000 and a boiling point above 50° C., and (B) one or more compounds copolymerizable with A but different therefrom, with a molecular weight of from 110 to 2,000, and carrying at least 2 N-vinyl groups and at least one carbonyl group bonded to the nitrogen of at least one N-vinyl group.

The olefinically unsaturated compound A will have a boiling point above 50° C., preferably above 100° C. Compounds of lower boiling point are generally less suitable, since they evaporate too easily after application of the coating composition but prior to its curing. This can firstly cause a change in the composition of the coating material, and can secondly lead to pollution of the environment with malodorous and, in some cases, toxic monomers. Compounds of vapor pressure below about 10 mm Hg at 100° C. are therefore particularly preferred for paints and printing inks which do not pollute the environment.

The molecular weight of the component A can vary within wide limits, namely from 70 to 20,000, i.e. both low molecular weight and high molecular weight compounds may be employed. Examples of suitable compounds are:

1. Esters of unsaturated monocarboxylic acids or dicarboxylic acids, e.g. esters of acrylic, methacrylic, α-cyanoacrylic, crotonic, cinnamic, sorbic, maleic, fumaric or itaconic acid with aliphatic, cycloaliphatic or aromatic-aliphatic monohydric to tetrahydric alcohols of from 3 to 20 carbon atoms, e.g. methyl (meth)acrylate, n-, i- and t-butyl (meth)acrylate, 2-ethylhexyl acrylate, lauryl acrylate, dihydrodicyclopentadienyl (meth)acrylate, methylglycol acrylate, hydroxyethyl (meth)acrylate, hydroxypropyl (meth)acrylate, ethylene glycol diacrylate, diethylene glycol diacrylate, triethylene glycol diacrylate, neopentyl glycol di(meth)acrylate, 1,4-dimethylol-cyclohexane diacrylate, pentaerythritol tri(meth)acrylate and pentaerythritol tetra(meth)acrylate, ethyl α-cyanoacrylate, ethyl crotonate, ethyl sorbate, diethyl maleate, diethyl fumarate and the di(meth)acrylate of oxyalkylated bisphenol A.

2. Amides of acrylic acid or methacrylic acid which can optionally be substituted at the nitrogen atom by alkyl, alkoxyalkyl or hydroxyalkyl radicals, e.g. N,N'-dimethylacrylamide, N-isobutylacrylamide, diacetoneacrylamide, N-methylolacrylamide, N-methoxymethylacrylamide, N-butoxy-methylacrylamide, N-butoxymethylmethacrylamide and ethylene glycol bis-(N-methylolacrylamide) ether.

3. Vinyl esters of monocarboxylic acids or dicarboxylic acids of from 2 to 20 carbon atoms, e.g. vinyl acetate, vinyl propionate, vinyl 2-ethylhexanoate, the vinyl ester of Versatic acid, divinyl adipate and the like.

4. Vinyl ethers of monohydric or dihydric alcohols of from 3 to 20 carbon atoms, e.g. isobutyl vinyl ether, hexyl vinyl ether, octadecyl vinyl ether, ethylene glycol divinyl ether, diethylene glycol divinyl ether, butanediol divinyl ether and hexanediol divinyl ether.

5. Mono-N-vinyl compounds, e.g. N-vinylpyrrolidone, N-vinylpiperidone, N-vinylcaprolactam, N-vinylmorpholinone, N-vinyloxazolidone, N-vinylsuccinimide, N-methyl-N-vinylformamide and N-vinylcarbazole.

6. Styrene and its derivatives, e.g. α-methylstyrene, 4-chlorostyrene or 1,4-divinylbenzene.

7. Allyl ethers and allyl esters, e.g. trimethylylolpropane diallyl ether, trimethylolpropane triallyl ether, pentaerythritol triallyl ether, diallyl maleate, diallyl fumarate or diallyl phthalate.

8. Unsaturated polyesters with a molecular weight of from 500 to 5,000 and with from 0.5 to 10 double bonds per 1,000 molecular weight units, manufactured, e.g., from (a) from 10 to 70 percent by weight of α,β-unsaturated dicarboxylic acid, such as maleic acid, fumaric acid or itaconic acid, (b) from 0 to 60 percent by weight of saturated aliphatic, cycloaliphatic or aromatic dicarboxylic acids, e.g. succinic acid, adipic acid, tetrahydrophthalic acid, hexahydrophthalic acid, cyclohexane-1,4-dicarboxylic acid, phthalic acid, isophthalic acid or terephthalic acid, (c) from 20 to 80 percent by weight of aliphatic, cycloaliphatic or non-phenolic aromatic diols, e.g. ethylene glycol, diethylene glycol, triethylene glycol, propane-1,2-diol, propane-1,3-diol, butane-1,2-diol, butane-1,3-diol, butane-1,4-diol, but-2-ene-1,4-diol, neopentyl glycol, hexane-1,6-diol or oxyalkylated bisphenol A, (d) from 0 to 5 percent by weight of tricarboxylic acids or tetracarboxylic acids, e.g. trimellitic acid, pyromellitic acid or benzenetetracarboxylic acid, (e) from 0 to 10 percent by weight of monocarboxylic acids, e.g. acetic acid, propionic acid or benzoic acid, (f) from 0 to 5 percent by weight of trihydric or tetrahydric alcohols, e.g. glycerol, trimethylolpropane or pentaerythritol and (g) from 0 to 10 percent by weight of monohydric alcohols, e.g. methanol, ethanol, propanol or butanol.

9. Unsaturated epoxy resins which have been manufactured e.g., from
   (a) monofunctional epoxides and acrylic or methacrylic acid, according to U.S. Pat. No. 2,484,487,
   (b) bifunctional epoxides and unsaturated fatty acids, according to U.S. Pat. No. 2,456,408,
   (c) polyfunctional aromatic epoxides and crotonic acid, according to U.S. Pat. No. 2,575,440 or
   (d) polyfunctional aromatic or aliphatic glycidyl ethers and acrylic acid or methacrylic acid, according to U.S. Pat. No. 2,824,851.

10. Unsaturated polyurethanes from hydroxyalkyl acrylates, diisocyanates and, optionally, polyols or polyamines, e.g. saturated or unsaturated polyesterpolyols, polyetherpolyols or copolymer-polyols, such as are described, e.g., in German Published Application No. 1,644,797 or, for use in printing inks, in German Published Specification No. 2,358,948.

11. Unsaturated copolymers, manufactured, e.g., by reaction of
   (a) copolymers, containing maleic anhydride groups, with unsaturated alcohols, e.g. according to German Published Application No. 2,050,893 or
   (b) acrylic ester copolymers, or polyesters, containing carboxylic acid groups, with unsaturated epoxides, e.g. glycidyl acrylate.

12. Butadiene polymers in which the double bonds are in the main present as vinyl side chains.

13. Diallyl phthalate prepolymers.

14. Poly-N-vinylurethanes, e.g. manufactured according to German Published Application No. 2,064,701 by reaction of vinyl isocyanate with saturated or unsaturated polyester-polyols, polyether-polyols or polyfunctional alcohols.

Of course, mixtures of the various unsaturated compounds A can also be used.

The N-vinyl compound B must be copolymerizable with A, but differs from A. It is a monomeric compound with a molecular weight of from 110 to 2,000, preferably from 112 to 500. It carries two N-vinyl groups and one or more carbonyl groups bonded to the nitrogen of at least one N-vinyl group. Preferred compounds are those of the general formula

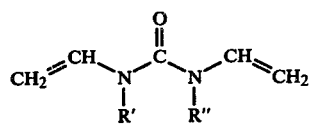

wherein R' and R" may be identical or different and are hydrogen, alkyl, cycloalkyl, aryl or aralkyl, each of not more than 12 carbon atoms; or, preferably, R' and R" are linked to form 5, 6 or 7-membered heterocyclic rings. The radicals R' and R" and the rings may be substituted by oxo, carboxyl, carbalkoxy, hydroxyl, alkoxy or amino.

Examples of suitable N-vinyl compounds are:

1. N,N-divinylureas of the above formula, where R' and R" are preferably identical and are hydrogen or alkyl of 1 to 6 carbon atoms. Such compounds are disclosed in C. G. Overberger and S. Ishida, Polymer Letters, 3 (1965), 789 to 791, and C. G. Overberger, G. Montando and S. Ishida, J. of Polym. Sci., Part A-1, 7 (1969), 35–46.

2. Cyclic divinylureas, divinylhydrazides and divinylamides of the following formulae, where R' and R" each have the above meanings

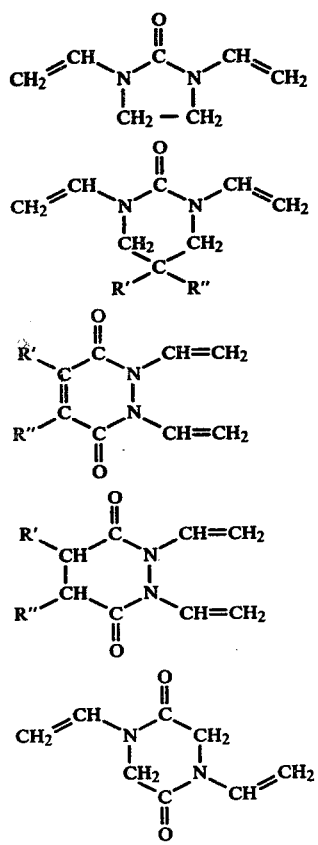

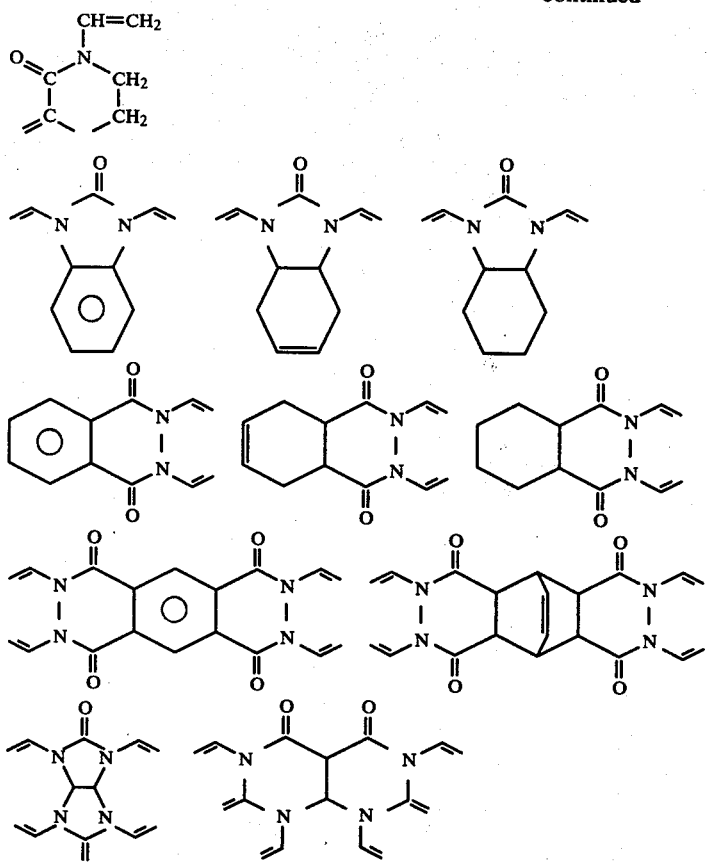

3. Divinylhydantoins of the general formula

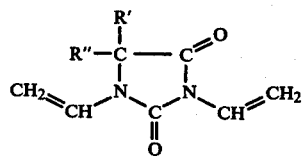

4. Divinyldihydrouracils of the formulae

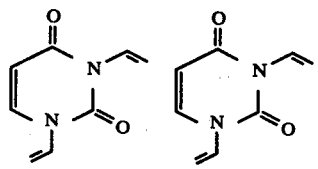

5. N-vinyl derivatives of heterocyclic acids of the formulae

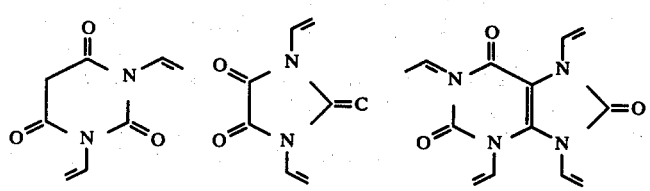

The components A and B can be employed in a weight ratio of from 99:1 to 1:99, preferably from 97:3 to 70:30.

Depending on its intended application, the coating composition of the invention may also contain appropriate additives, e.g.:

1. From 0 to 70, preferably from 10 to 50, percent by weight of inorganic or organic pigments, e.g. carbon black, titanium dioxide, chalk, barite, zinc white, lithopone, chrome yellow, iron oxide yellow or complex organic pigments, e.g. phthalocyanines, azo pigments, anthraquinone pigments and quinacridone pigments.

2. From 0 to 10, preferably from 0.001 to 3, percent by weight of dyes, e.g. eosin, Crystal Violet and Malachite Green.

3. From 0 to 10, preferably from 1 to 5, percent by weight of a flow control agent.

4. From 0 to 1, preferably from 0.001 to 0.5, percent by weight of inhibitors.

5. From 0 to 70, preferably from 10 to 50, percent by weight of fillers.

6. From 0 to 10, preferably from 1 to 5, percent by weight of diluents.

7. From 0 to 70, preferably from 10 to 50, percent by weight of inert synthetic resins.

8. From 0 to 7, preferably from 0.5 to 5, percent by weight of waxes and

9. From 0 to 5, preferably from 0.2 to 5, percent by weight of thixotropic agents.

The coating compositions of the invention are cured by copolymerization of the components A and B. This polymerization can be effected thermally, by direct heating, by infrared radiation or by means of initiators, but preferably by means of high energy radiation.

For thermal polymerization, temperatures of from 20° to 200° C. are employed; the conventional initiators, e.g. organic peroxides or azo compounds, and accelerators, e.g. cobalt salts, may be added in amounts of from 0.5 to 6 percent by weight.

Radiation curing can be effected with UV rays or electron beams. In the former case, conventional photoinitiators are added, e.g. those described by B. J. Kosar in "Light-sensitive Systems", Wiley, 1965, pages 158-193. The following are preferred: benzoin, benzoin ethers, diacetyl, benzil, benzil-monoketals, benzophenone, Michler's ketone, xanthones, anthraquinones, sulfur compounds, e.g. disulfides, thiols or dithiocarbamates, or carbonyl compounds, e.g. triphenylphosphine-iron tetracarbonyl in conjunction with chlorine donors, each of the compounds being used in amounts of from 1 to 3 percent by weight. Details of the method of curing with UV rays are to be found in "Photopolymerization" by H. Barzynski, K. Penzien and O. Volkert in Chemiker-Zeitung 96 (1972), 545-551, and in German Published Application No. 2,251,933. Curing by electron beams is described in detail in German Published Application No. 2,049,715 referred to above. This application also gives further details on suitable coating thickness, radiation doses and irradiation times.

The coating compositions of the invention may be used for coating and surface-finishing metals, wood, plastics, leather and paper. These coatings may be protective or decorative.

The coating compositions may also be used as photopolymer layers in printing plates, e.g. relief printing plates or planographic printing plates, or for photoresists. In these applications, the compositions are cured by image-wise exposure of the coated carrier; no curing takes place in the unexposed areas and these parts of the layer are subsequently dissolved out.

Finally, the coating compositions may be used to manufacture UV-curing printing inks and print pastes. In this case, substrates, e.g. paper, metals or plastic films, are printed with layers of from about 0.5 to 5μ of binders containing pigments. UV irradiation cures the binders very rapidly and the color is fixed on the substrate. The printing ink manufactured using the coating compositions of the invention exhibit extremely rapid drying in four-color printing, at maximum print speed, when using merely 1 or 2 UV lamps. The prints in process of drying have very good scuff resistance. This property shows a great improvement over comparable UV printing inks for colors (e.g. blue and black) which, in UV printing, are particularly critical in this respect. These remarks apply particularly to prints produced at maximum print speeds and therefore minimum irradiation times.

Without added pigments, the binders may be used as over-printing varnishes.

The parts and percentages in the Examples are by weight.

EXAMPLES

1. An unsaturated polyester of acid number 45 mg of KOH/g was manufactured by melt condensation of 2 moles of maleic anhydride, 1 mole of phthalic anhydride and 3.05 moles of propylene glycol. The product was divided into two parts and converted to surface-coating solutions as follows:

(a) Solution according to the invention:
37% of the unsaturated polyester
50% of butane-1,4-diol diacrylate
3% of diethylaminoethyl acrylate (stabilizer)
10% of divinylpropyleneurea.

(b) Comparative experiment:
37% of the unsaturated polyester
3% of diethylaminoethyl acrylate
60% of butane-1,4-diol diacrylate.

60μ thick coats of both mixtures were applied to cleaned steel sheet and irradiated under an inert gas, with electrons (320 KV, 50 mA). This gave the following results:

TABLE 1

| | Rate of travel of steel strip | 24 m/min | 40 m/min |
|---|---|---|---|
| Mixture 1a | Surface: | scratch-resistant and non-tacky | scratch-resistant and non-tacky |
| | Pendulum hardness: | 195 sec | 175 sec |
| Mixture 1b | Surface: | scratch-resistant and non-tacky | not scratch-resistant, tacky |
| | Pendulum hardness: | 63 sec | 20 sec |

The Koenig pendulum hardness was measured according to DIN 53,157.

In addition, 3% of benzoin butyl ether was added to each sample. 40μ thick coatings on glass plates were covered with a polyester film and irradiated with a fluorescent tube (Sylvania 590 MM, 20 Watt). The results obtained were as follows:

TABLE 2

| | Duration of irradiation | 2 mins. | 1 min. |
|---|---|---|---|
| Mixture 1a | Surface: | scratch-resistant non-tacky | scratch-resistant non-tacky |
| | Pendulum hardness: | 115 sec | 102 sec |
| Mixture 1b | Surface: | not scratch-resistant, tacky | not scratch-resistant, tacky |
| | Pendulum hardness: | 104 sec | 60 sec |

2. The unsaturated polyester from Example 1 was converted to a casting resin of the following composition:
37.2% of polyester
48.3% of butane-1,4-diol diacrylate
3.1% of diethylaminoethyl acrylate
11.4% of N,N'-divinyl-5,5-dimethylpropyleneurea.

Irradiation of a 60μ thick coat on steel sheet, under the same experimental conditions as in Example 1 and at a rate of travel of the strip of 20 m/min, gave a scratch-resistant and non-tacky surface and a pendulum hardness of 198 sec.

A sample to which 3% of benzoin butyl ether had been added cured in 2 minutes, on irradiation, under polyester film, with the UV lamp described in Example 1, to give a non-tacky and scratch-resistant film of pendulum hardness 180 sec.

3. An unsaturated polyester of acid number 32 mg of KOH/g was manufactured by melt condensation of 2 moles of maleic anhydride and 1 mole of hexachloroendomethylenetetrahydrophthalic acid, 1 mole of propylene glycol and 2 moles of neopentyl glycol. The product was converted to a casting resin of the following composition:
  34.0% of unsaturated polyester
  43.1% of butane-1,4-diol diacrylate
  2.8% of diethylaminoethyl acrylate
  20.1% of N,N'-divinylpropyleneurea.

Irradiation of a 60μ thick coat on steel sheet, using accelerated electrons (320 KV, 50 mA), at a rate of travel of the strip of 50 m/min, gave a scratch-resistant and non-tacky surface coating of pendulum hardness 164 sec.

4% of benzoin butyl ether were added to the sample and a 60μ thick coat of the mixture was applied to a glass plate, using a doctor blade. The coat was covered with polyester film and irradiated with the UV lamp described above. The duration of irradiation was 3 minutes and a coating having a scratch-resistant and non-tacky surface and a pendulum hardness of 185 sec was obtained.

4. A mixture was prepared from 40 parts of a reaction product of hexamethylenediisocyanate with two equivalents of hydroxypropyl acrylate, 50 parts of a copolymer of 93% of methyl methacrylate and 7% of acrylic acid, having an acid number of 90 (manufactured by solution polymerization in ethyl acetate) as an additional acid binder, 2 parts of benzophenone as a photoinitiator, 0.5 part of p,p'-dimethylaminobenzophenone as an additional photoinitiator, 0.01 part of Crystal Violet as a dye and 400 parts of methyl ethyl ketone as the solvent.

Coating solutions were prepared from this mixture by addition of 8 parts of one of the following:
  (a) N,N'-divinyldimethylpropyleneurea,
  (b) N,N'-divinylpropyleneurea,
  (c) N,N'-divinylethyleneurea and
  (d) a reaction product of hexamethylenediisocyanate and hydroxypropyl acrylate (comparative experiment).

The mixtures were applied to 0.3 mm thick, electrolytically roughened and anodized aluminum sheets as conventionally used in offset printing, in amounts which after evaporation of the solvent left a layer of 3.9 g/m². The planographic printing plates thus obtained are exposed imagewise through a halftone negative, employing a commercially available Xenon impulse lamp, and were cured by this treatment; they were then developed with a solution of 10 g of sodium hydrogen phosphate and 10 ml of butoxyethanol in 100 ml of water, the binder being dissolved out from the unexposed and therefore non-cross-linked areas. The exposure time required for complete formation and anchoring of a 10% screen area is shown in the table which follows. Corresponding values for printing plates provided with a protective layer of polyvinyl alcohol applied in accordance with German Printed Application No. 1,572,153 are also shown.

TABLE 3

| Experiment | Exposure time without | with PVA protective layer |
| --- | --- | --- |
| a | 25 sec | 16 sec |
| b | 20 sec | 15 sec |

TABLE 3-continued

| Experiment | Exposure time without | with PVA protective layer |
| --- | --- | --- |
| c | 20 sec | 16 sec |
| d | 120 sec | 20 sec |

The table clearly shows that the inhibiting effect of atmospheric oxygen is only slight when the N,N'-divinyl compounds of the invention are used. This makes it possible to manufacture photopolymeric offset printing plates even without an additional oxygen barrier layer.

5. Mixture 4c was applied to an 80 mesh/cm nylon fabric, and dried. After image-wise exposure for 3 minutes through a positive original in a commercially available exposure apparatus fitted with 8 low-pressure fluorescent tubes, the fabric was washed with a mixture of methyl ethyl ketone and the developer solution described above, in the ratio of 1:1. The screen-printing screen thus obtained was usable for image-wise transfer of ink onto a textile fabric.

6. A solution of 100 parts of a polyamide which is soluble in aqueous alcohol and is prepared from approximately equal parts of hexamethylenediamine adipate, 4,4'-diaminodicyclohexylmethane adipate and ε-caprolactam, 8 parts of triethylene glycol bis-acrylamide, 22 parts of the diether of 1 mole of ethylene glycol and 2 moles of N-methylolacrylamide, 1 part of benzoin methyl ether as the initiator, 0.1 part of the ammonium salt of N-nitrosocyclohexylhydroxylamine as the stabilizer and 0.04 part of the 1:1 chromium complex of the azomethine dye obtained from 4-nitro-2-aminophenol-6-sulfonic acid and 2-hydroxybenzaldehyde (Color Index No. 48,045), in 400 ml of methanol was prepared. Either (a) 20 parts of N,N'-divinylethyleneurea (according to the invention), or (b) 20 parts of m-xylylene-bis-acrylamide (comparative experiment) were added to this solution.

Printing plates of 0.6 mm relief height were prepared from the mixtures in the manner described in Example 1 of German Published Application No. 1,905,012. The table which follows shows the results:

TABLE 4

| Experiment | Exposure limit (mins.) lower | upper |
| --- | --- | --- |
| a | 4 | 8 |
| b | 6 | 10 |

7. The coating solution 1c was coated, using a doctor blade, onto a phenolic resin paper to which a 40μ thick copper foil had been laminated; after evaporation of the solvent, a 5μ layer remained. After an exposure time of 40 seconds through a line positive and subsequent immersion in methyl ethyl ketone, the plate was etched for 2 minutes with a concentrated solution of iron-III chloride. After rinsing with water and baring the copper which had not been etched, by rubbing with dimethylformamide, an electronic component was obtained.

8. An epoxy resin acrylate was manufactured from Epikote ® 1,004 (bisphenol-A epoxy resin having an epoxide value of 0.112) and 96% of the stoichiometrically required amount of acrylic acid.

(a) The epoxy resin was converted to a printing ink binder of the following composition:
  45 parts of epoxy resin acrylate
  35 parts of ethylene glycol diacrylate
  15 parts of N,N'-divinyl-5,5-dimethylpropyleneurea 5 parts of α-methylolbenzoin methyl ether and
0.1 part of phenothiazine.

A 6μ thick layer of the binder was applied to art paper, using a doctor blade, and was exposed, until non-tacky, in an "Ideal" flat-bed exposure apparatus from Moll, Solingen, equipped with fluorescent tubes of the type described in Example 1. The exposure time was 1.5 minutes.

If a mercury high pressure lamp rated at 36 Watt per cm of arc length (Q 1200 from Original Hanau Quarzlampengesellschaft GmbH) was used, at a distance of 20 cm, the exposure time required was 1 second.

A colorless non-tacky coating which was hard when tested with the finger-nails is obtained in both cases.

(b) For comparison, a binder without N,N'-divinyl compound was prepared from
45 parts of epoxy resin acrylate
50 parts of ethylene glycol diacrylate
5 parts of α-methylolbenzoin methyl ether and
0.1 part of phenothiazine
and was tested under identical conditions. Exposure time in a flat-bed exposure apparatus: 5 minutes, exposure time under a high pressure lamp: 4 seconds.

The comparison shows the substantially improved rate of curing if the N,N'-divinyl compound is used.

(c) The binders under (a) and (b) were each milled with titanium dioxide (anatase) in the weight ratio of 1:1 on a triple-roll mill. Solid prints of about 2μ layer thickness were produced on cleaned steel sheet, on a proof press, and were then irradiated under a mercury high pressure lamp.

Exposure times:
white ink with binder (a): 2.5 seconds
white ink with binder (b): 8 seconds 9. Printing ink binders, essentially containing urethane acrylates, as described in German Published Application No. 2,358,948, were manufactured, but N,N'-divinyl compounds were employed as reactive diluents.

Binders were prepared from
(a) 20 parts of urethane-acrylate, manufactured from a biuret-isocyanate (Desmodur ® N) by reaction with an equivalent amount of hydroxypropyl acrylate, 55 parts of urethane acrylate, manufactured by reaction with hexamethylenediisocyanate with equivalent amounts of hydroxypropyl acrylate, 5 parts of urethane-acrylate, manufactured by reaction of bis-(3-methyl-4-isocyanato-cyclohexyl)-methane with equivalent amounts of hydroxypropyl acrylate, 15 parts of N,N'-divinylethyleneurea, 5 parts of Michler's ketone, 5 parts of benzophenone and 0.2 part of phenothiazine;

(b) As under (a), except that N,N'-divinylpropyleneurea was used.

(c) As under (a), except that N,N'-divinyldimethylpropyleneurea was used.

The binders were printed on art paper using a proof press and the exposure time required for the coating to become non-tacky was determined, as indicated in Example 8.

| Flat-bed exposure apparatus: | (a) 1 sec. |
| | (b) 1 sec. |
| | (c) 2 sec. |
| High pressure lamp: | (a) <0.1 sec. |
| | (b) <0.1 sec. |
| | (c) <0.1 sec. |

10. The binder from Example 9c was ground with 18% of Heliogen Blue ® 7080 on a triple-roll mill. The printing ink was used to print at a rate of 12,000 sheets/hour on a sheet-fed offset printing machine equipped with a UV curing device comprising 1 UV lamp rated at 80 W/cm of arc length. The prints in the stack immediately were completely non-tacky and smudge-resistant, and had good gloss and sharpness of print. After a short period of storage, a scuff test was carried out using a Patra test instrument. The scuff resistance was assessed to be good to very good.

On repeating the experiment with a printing ink which in addition contained 3% of a slip agent (polyethylene wax), the scuff resistance was rated as "very good".

We claim:
1. A coating composition that is curable by means of high energy radiation containing as a binder a mixture of
(A) 70 to 97% by weight of one or more olefinically polyunsaturated esters with a molecular weight of from 70 to 20,000 and a boiling point above 50° C., and
(B) 30 to 3% by weight of one or more compounds copolymerizable with (A) but different therefrom, with a molecular weight of from 110 to 2,000, and carrying at least two N-vinyl groups and at least one carbonyl group, each nitrogen of the N-vinyl groups being bonded to a carbonyl group, said carbonyl group in turn being bonded to a nitrogen or carbon atom.

2. The coating composition of claim 1, wherein component (B) is an N,N-divinylurea of the formula

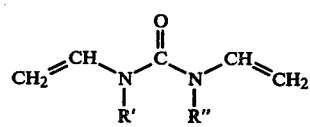

wherein R' and R" may be identical or different and are selected from the group consisting of hydrogen, alkyl, cycloalkyl, aryl and aralkyl, each of not more than 12 carbon atoms, and R' and R" are linked to form a 5-, 6- or 7-membered heterocyclic ring, the radicals R' and R" and the rings may be substituted by oxo, hydroxyl or alkoxy.

3. The coating composition of claim 1, wherein component (B) is at least one member of the group consisting of a cyclic divinylhydrazide, a cyclic divinylamide, a divinylhydantoin and a divinyldihydrouracil.

4. A coating composition that is curable by means of high energy radiation containing as a binder a mixture of
(A) 70 to 97% by weight of an olefinically unsaturated polyester resin having a molecular weight of from 500 to 5,000 and from 0.5 to 10 double bonds per 1,000 molecular weight units, and,
(B) 30 to 3% by weight of one or more compounds copolymerizable with (A) but different therefrom, with a molecular weight of from 110 to 2,000, and carrying at least two N-vinyl groups and at least one carbonyl group, each nitrogen of the N-vinyl groups being bonded to a carbonyl group, said carbonyl group in turn being bonded to a nitrogen or carbon atom.

5. The coating composition of claim 4 in which (A) is an unsaturated polyester manufactured by melt condensation of maleic anhydride, phthalic anhydride and propylene glycol and wherein (B) is divinylpropyleneurea.

6. The coating composition of claim 4, wherein component (B) is an N,N-divinylurea of the formula

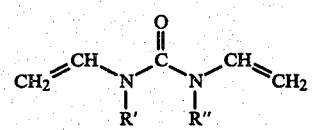

wherein R' and R" may be identical or different and are selected from the group consisting of hydrogen, alkyl, cycloalkyl, aryl and aralkyl, each of not more than 12 carbon atoms, and R' and R" are linked to form a 5-, 6- or 7-membered heterocyclic ring, the radicals R' and R" and the rings may be substituted by oxo, hydroxyl or alkoxy.

7. The coating composition of claim 4, wherein component (B) is at least one member of the group consisting of a cyclic divinylhydrazide, a cyclic divinylamide, a divinylhydantoin and a divinyldihydrouracil.

* * * * *